US008068209B2

(12) United States Patent
Poon et al.

(10) Patent No.: US 8,068,209 B2
(45) Date of Patent: Nov. 29, 2011

(54) NOZZLE TO HELP REDUCE THE ESCAPE OF IMMERSION LIQUID FROM AN IMMERSION LITHOGRAPHY TOOL

(75) Inventors: Alex Ka Tim Poon, San Ramon, CA (US); Leonard Wai Fung Kho, San Francisco, CA (US); Guarav Keswani, Fremont, CA (US); Derek Coon, Redwood City, CA (US)

(73) Assignee: Nikon Corporation, Tokyo (JP)

( * ) Notice: Subject to any disclaimer, the term of this patent is extended or adjusted under 35 U.S.C. 154(b) by 663 days.

(21) Appl. No.: 12/073,783

(22) Filed: Mar. 10, 2008

(65) Prior Publication Data

US 2008/0231822 A1   Sep. 25, 2008

Related U.S. Application Data

(60) Provisional application No. 60/907,178, filed on Mar. 23, 2007.

(51) Int. Cl.
G03B 27/42 (2006.01)
G03B 27/52 (2006.01)

(52) U.S. Cl. ............................................. 355/53; 355/30
(58) Field of Classification Search .................... 355/30, 355/53, 67
See application file for complete search history.

(56) References Cited

U.S. PATENT DOCUMENTS

| | | | |
|---|---|---|---|
| 4,509,852 A | 4/1985 | Tabarelli et al. | |
| 7,474,379 B2 * | 1/2009 | Donders et al. | 355/53 |
| 2005/0007569 A1 | 1/2005 | Streefkerk et al. | |
| 2006/0023182 A1 | 2/2006 | Novak et al. | |
| 2006/0038968 A1 | 2/2006 | Kemper et al. | |
| 2006/0152697 A1 | 7/2006 | Poon et al. | |
| 2006/0250593 A1 | 11/2006 | Nishii | |
| 2007/0109512 A1 | 5/2007 | Kate et al. | |
| 2007/0110213 A1 | 5/2007 | Leenders et al. | |
| 2007/0139628 A1 * | 6/2007 | Nagasaka et al. | 355/30 |
| 2007/0279608 A1 | 12/2007 | Poon et al. | |

FOREIGN PATENT DOCUMENTS

| | | |
|---|---|---|
| EP | 1 420 299 A2 | 5/2004 |
| EP | 1 477 856 A1 | 11/2004 |
| EP | 1 768 169 A1 | 3/2007 |
| WO | WO 2005/024517 A2 | 3/2005 |
| WO | WO 2005/111722 A2 | 11/2005 |
| WO | WO 2005/119742 A1 | 12/2005 |

* cited by examiner

Primary Examiner — Hung Henry Nguyen
(74) Attorney, Agent, or Firm — Oliff & Berridge, PLC (57) ABSTRACT

An immersion lithography tool with a diverter element, positioned between the immersion element and the substrate, for altering the "footprint" or shape of the meniscus of the body of immersion liquid between the last optical element and an immersion element on one side, and the substrate on the other side when the substrate is moved. The apparatus includes a substrate holder to hold the substrate having an imaging surface and a projection optical system having a last optical element. The projection optical system projects an image onto a target imaging area on the substrate through the immersion liquid filled in a gap between the imaging surface of the substrate and the last optical element. An immersion element maintains the immersion fluid in the gap. The diverter element is positioned between the immersion element and the substrate. The diverter element alters the footprint shape of the meniscus of the body of immersion liquid, thereby preventing or reducing the amount of leakage from a space between the substrate and the immersion element.

8 Claims, 9 Drawing Sheets

NOZZLE TO HELP REDUCE THE ESCAPE OF IMMERSION LIQUID FROM AN IMMERSION LITHOGRAPHY TOOL

RELATED APPLICATIONS

This application claims priority on Provisional Application Ser. No. 60/907,178 filed on Mar. 23, 2007, the content of which is incorporated herein by reference for all purposes.

BACKGROUND

1. Field of the Invention

The present invention relates to immersion lithography tools, and more particularly, to an immersion lithography tool with an element, positioned between an immersion element and an object (e.g., a substrate), to prevent or reduce leakage of immersion fluid when the object is moved.

2. Related Art

A typical lithography tool includes a radiation source, a projection optical system, and a substrate stage to support and move a substrate to be imaged. A radiation-sensitive material, such as resist, is coated onto the substrate surface prior to placement onto the substrate stage. During operation, radiation energy from the radiation source is used to project an image defined by an imaging element through the projection optical system onto the substrate. The projection optical system typically includes a number of lenses. The lens or optical element closest to the substrate is often referred to as the "last" or "final" optical element.

The projection area during an exposure is typically much smaller than the imaging surface of the substrate. The substrate therefore has to be moved relative to the projection optical system to pattern the entire surface. In the semiconductor industry, two types of lithography tools are commonly used. With so-called "step and repeat" tools, the entire image pattern is projected at once in a single exposure onto a target area of the substrate. After the exposure, the wafer is moved or "stepped" in the X and/or Y direction and a new target area is exposed. This step and repeat process is performed over and over until the entire substrate surface is exposed. With scanning type lithography tools, the target area is exposed in a continuous or "scanning" motion. The imaging element is moved in one direction, while the substrate is moved in either the same or the opposite direction during exposure. After each scan, the substrate is then moved in the X and/or Y direction to the next scan target area. This process is repeated until all the desired areas on the substrate have been exposed.

It should be noted that lithography tools are typically used to image or pattern semiconductor wafers and flat panel displays. The term "substrate", as used herein, is intended to generically mean any work piece that can be patterned, including, but not limited to, semiconductor wafers and flat panel displays.

Immersion lithography systems use a layer of fluid that fills a gap between the final optical element of the projection optical system and the substrate. The fluid enhances the resolution of the system by enabling exposures with a numerical aperture (NA) greater than one, which is the theoretical limit for conventional "dry" lithography. The fluid in the gap permits the exposure with radiation that would otherwise be completely internally reflected at the optical-air interface. With immersion lithography, numerical apertures as high as the index of refraction of the fluid are possible. Immersion also increases the depth of focus for a given NA, which is the tolerable error in the vertical position of the substrate, compared to a conventional dry lithography system. Immersion lithography therefore has the ability to provide greater resolution than can be performed using conventional dry lithography, as the fluid essentially becomes part of the optical system of the lithography tool.

One known way of maintaining the immersion fluid in the gap where exposure of the substrate is to occur is with the use of an air curtain. For more information on air curtain type immersion tools, see for example U.S. Patent publication 2005/0007569 or European Patent Applications EP 1 477 856 A1 and EP 1 420 299 A2, incorporated by reference herein for all purposes.

It is also known to maintain the immersion fluid in the gap between the last optical element and the imaging surface of the substrate by submersing both in a container filled with immersion fluid. See for example U.S. Pat. No. 4,509,852, also incorporated by reference herein.

Another known way of maintaining the immersion fluid within the gap of a lithography tool is with the use of a confinement member that surrounds the last optical element immediately above the area to be exposed on the substrate. For more information on confinement member type immersion lithography tools, see U.S. application Ser. No. 11/362, 833, and PCT Application Serial Numbers. PCT/US2004/22915 and PCT/US2005/14200, all incorporated herein by reference for all purposes, all incorporated herein by reference for all purposes.

In yet another approach, which is a variation of the above-described submersion type tool, a large confinement plate is used for submerging the substrate to be imaged in the immersion fluid. For more details on confinement plate type immersion lithography tools, see U.S. patent publication 2007/0279608, incorporated by reference herein.

During semiconductor wafer fabrication for example, wafers are typically patterned one after another by the lithography tool. After a wafer has been patterned, it is replaced and the next wafer is exposed. This process is completed over and over, typically as fast as possible, to increase throughput. During a wafer exchange, the just exposed wafer typically has to be moved a relatively long distance from the exposure area to the wafer exchange area. Once the exchange takes place, the new wafer undergoes another relatively long-move to an alignment area. After alignment, the wafer undergoes yet another long-move back to the exposure area for exposure. For the sake of simplicity, all of the above-described moves are hereafter generically referred to as "long-moves".

Long-moves can be problematic with confinement member type immersion tools under certain circumstances. If the speed during a long-move is too fast, there is a tendency for the immersion fluid to leak out from under the confinement member, leaving a trail of water behind on the wafer. This problem can be either mitigated or altogether eliminated by reducing the speed of the long-moves. The drawback of the reduced speed, however, is that throughput is reduced as well.

SUMMARY

An immersion lithography tool with a diverter element, positioned between the immersion element and the substrate, for altering the "footprint" or shape of the meniscus of the body of immersion liquid between the last optical element and the substrate when the substrate is moved, is disclosed. The apparatus includes a substrate holder to hold a substrate having an imaging surface and a projection optical system having a last optical element. The projection optical system projects an image onto a target imaging area on the substrate through an immersion liquid filled in the gap between the imaging surface of the substrate and the last optical element.

The diverter element is positioned between the immersion element and the substrate. The diverter element alters the footprint shape of the meniscus of the body of immersion liquid, thereby preventing or reducing the amount of leakage from a space between the immersion element and the substrate.

BRIEF DESCRIPTION OF THE DRAWINGS

Like reference numerals in the figures refer to like elements.

DETAILED DESCRIPTION

Figure 1A:
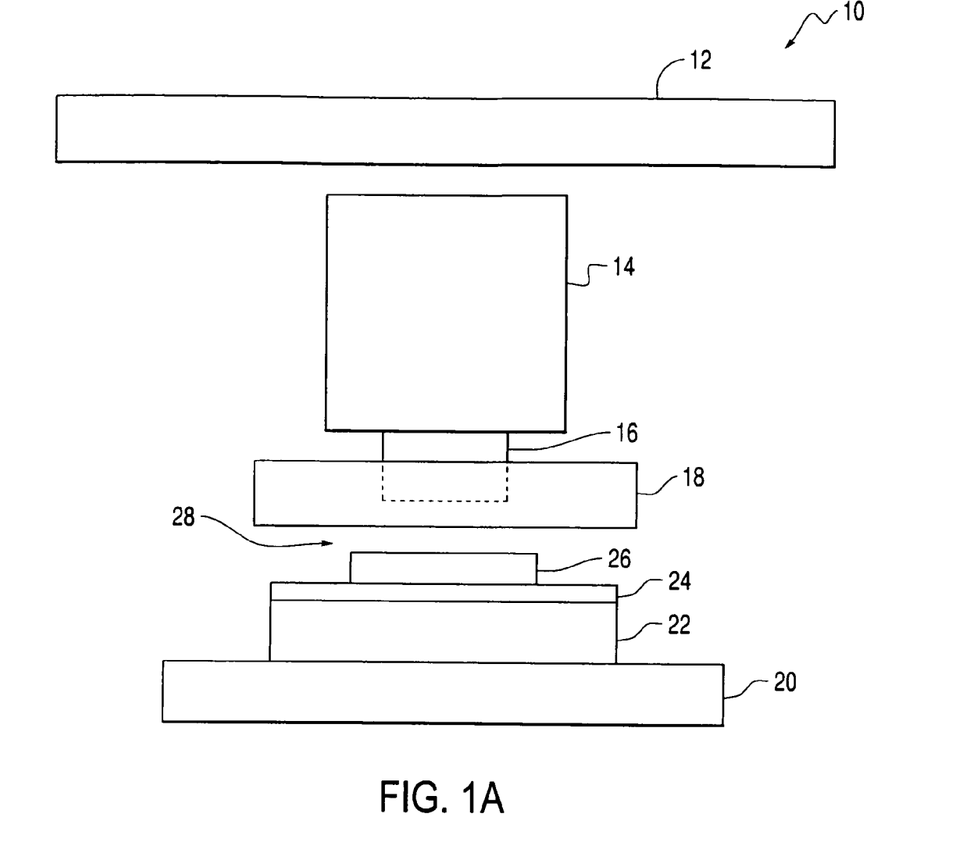
FIG. 1A is a diagram of a lithography tool having an immersion element with a diverter element according to the present invention.

Referring to FIG. 1A, an immersion lithography tool or apparatus is shown. The immersion lithography apparatus 10 includes an imaging element 12 which defines an image, a projection optical system 14 which includes a "last" or "final" optical element 16, an immersion element 18, a coarse stage 20, a fine stage 22, and a substrate chuck 24 for holding a substrate 26, and a space 28 under the last optical element 16 and the immersion element 18. The space 28 includes a gap provided between the top surface of the substrate 26 and the last optical element 16, when the last optical 16 and the top surface of the substrate 26 are opposite to each other. In one embodiment, the immersion element 18 is a confinement member, by which the gap between the substrate 26 and the last optical element 16 is filled with an immersion fluid 29 (not visible in FIG. 1A). Again, for more information on confinement member type immersion lithography tools, see U.S. application Ser. No. 11/362,833, PCT Application Serial Numbers. PCT/US2004/22915 and PCT/US2005/14200, all incorporated herein by reference for all purposes.

Figure 1B:
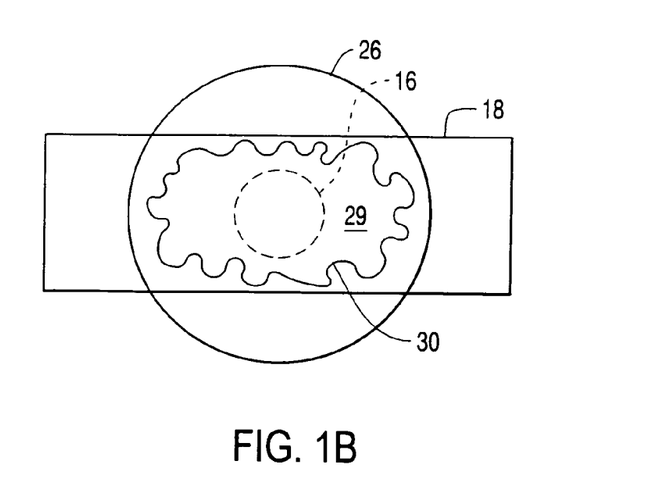
FIG. 1B is a diagram of the meniscus footprint of the body of immersion fluid in the immersion tool of the present invention.

Referring to FIG. 1B, a top-down view of the immersion fluid 29 between the immersion element 18 and the last optical element 16 on one side and the substrate 26 on the other side is shown. In one embodiment, the immersion fluid 29 is a liquid, such as water. The perimeter or the meniscus 30 of the immersion fluid 29, which is defined as the interface where the immersion fluid 29 is in contact with the ambient gas, defines a "footprint" or an outer shape of the body of fluid 29 under the immersion element 18. When the substrate 26 is moved, during a long-move for example, the meniscus 30 of the body of fluid 29 may be altered in an undesirable way. It should be noted that the diagram of FIG. 1B is for illustrative purposes, and is not necessarily drawn to scale. Also a number of elements, such as the remainder of the projection optical system 14 and the substrate chuck 24, are not shown for the sake of clarity.

The present embodiment is directed to a meniscus control element positioned under the immersion element 18. The meniscus control element may be a diverter element, as described in detail below, which is configured to alter the footprint shape of the body of immersion fluid 29. In the following explanation, although the substrate 26 is positioned or moved under the immersion element 18 and the optical element 16, an object other than the substrate 26 can be positioned or moved under the immersion element 18 and the optical element 16.

Figure 2A:
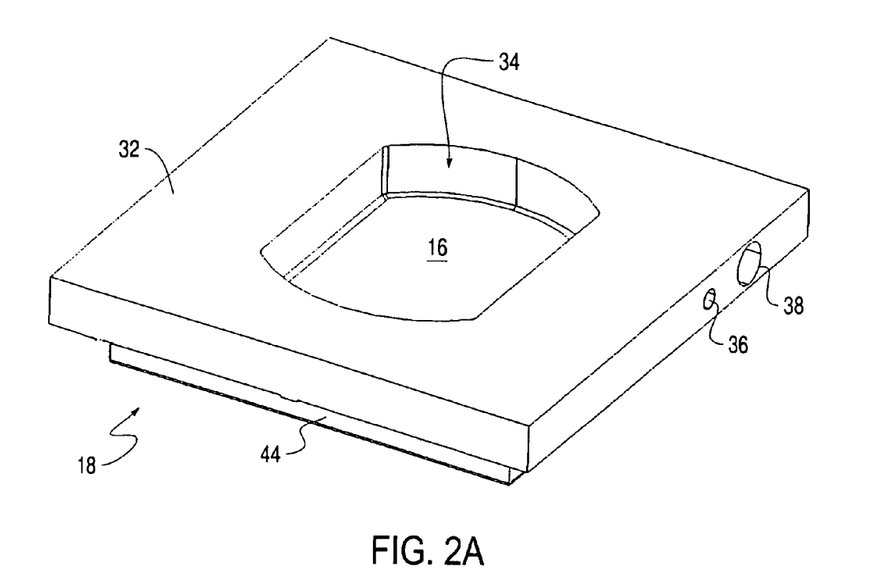
FIGS. 2A-2B are top and bottom perspective views of the immersion element with the diverter element according to one embodiment of the present invention.
Figure 2B:
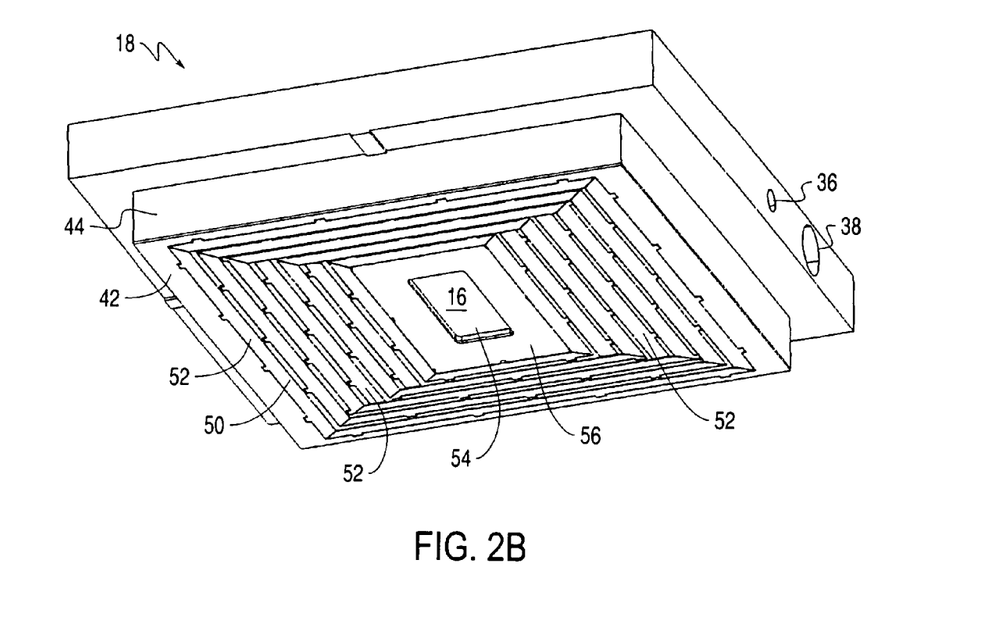

Referring to FIGS. 2A-2B, top and bottom perspective views of the immersion element 18 with a meniscus control element 50, according to one embodiment, is shown. In this embodiment, the meniscus control element 50 is a diverter element.

FIG. 2A shows a top-down perspective view of the immersion element 18. The immersion element 18 includes a top plate 32, a bottom plate 44 and a recess 34. A part of the last optical element 16 is positioned within the recess 34 (for the sake of clarity, the remainder of the projection optical system 14 is not illustrated). The immersion element 18 also includes at least one fluid supply inlet 36 and outlet 38 for supplying and recovering the immersion fluid respectively. Again for the sake of simplicity, only one inlet 36 and outlet 38 is shown. In alternative embodiments, a plurality of inlets 36 and outlets 38 may be used.

FIG. 2B shows a bottom-up perspective view of the immersion element 18, including a fluid removal element 42 provided on the bottom plate 44. As illustrated in this view, the fluid removal element 42 is provided between the bottom plate 44 of the immersion element 18 and the diverter element 50. The immersion element 18 (the bottom plate 44) includes an aperture 54, which is positioned at the center of the concentric diverter elements 52 and under the last optical element 16, and through which the image is projected onto the top surface of the substrate 26. The immersion element 18 (the bottom plate 44) includes a non-removal area 56 which surrounds the aperture 52. The non-fluid removal area 56 is substantially flat. The non-fluid removal area 56 and the top surface of the substrate 26 are substantially parallel to one another. The non-fluid removal area 56 is provided for containing the immersion fluid 29. The fluid removal element 42 is provided further away from the aperture 54 than the non-fluid removal area 56. In this embodiment, the fluid removal element 42 surrounds the non-fluid removal area 56. The fluid removal element 42 has a bottom surface that partially faces the diverter element 50. In this embodiment, the bottom surface of the fluid removal element 42 is substantially co-planar with the surface of the non-fluid removal area 56. In one embodiment, the bottom surface of the fluid removal element 42 may not be co-planar with the surface of the non-fluid removal area 56. For example, the bottom surface of the fluid removal element 42 may be provided further away from the top surface of the substrate 26 than the non-fluid removal area 56. The fluid removal element 42 is configured to contain and remove the immersion fluid 29. The diverter element 50 is provided under the immersion element 18 (i.e., between the fluid removal element 42 and the substrate 26). The diverter element 50 includes a plurality of diverter members 52. Each of the diverter members 52 is square or rectangular shaped. The diverter members 52 are provided in a concentric arrangement with respect to one another. As illustrated in FIG. 5C, the diverter members 52 are provided further away from the aperture 54 than the non-fluid removal area 56 in a direction. The diverter members 52 are provided spaced away from one another by a distance in the direction. The diverter members are arranged along the bottom surface of the fluid removal element 42. As illustrated in FIG. 5C, the individual diverter members 52 have respective top surfaces which face the bottom surface of the fluid removal element 42 with a gap. The top surfaces of the diverter members 52 are substantially co-planar with one another. In another embodiment, the top surfaces of the diverter members 52 may not be co-planar with one another. As illustrated in FIG. 5C, the individual diverter members 52 have respective bottom surfaces which face the surface of the substrate 26 with a gap. The bottom surfaces of the diverter members 52 are substantially co-planar with one another. In another embodiment, the bottom surfaces of the diverter members 52 may not be co-planar with one another.

During operation, the immersion fluid 29 is introduced into the immersion element 18 through the one or more inlets 36. The fluid 29 fills at least part of the space 28, including the gap between the optical element 16 and the substrate 26 and at least part of a gap between the non-fluid removal area 56 and the substrate 26. The fluid removal element 42 recovers the fluid 29 and passes it through the one or more outlets 38, where it can be either discarded or reused. In various embodiments, the fluid removal element 42 can be a mesh, a porous material (porous member), or outlets. For more details of these types of fluid recovery elements, see U.S. application Ser. No. 11/362,833, and PCT Application Serial Numbers. PCT/US2004/22915, PCT/US2005/14200, U.S. patent application Ser. No. 11/523,595, U.S. Patent publication 2005/0007569 or European Patent Applications EP 1 477 856 or A1 and EP 1 420 299 A2, again, all of which are incorporated herein by reference. In no way should these embodiments be construed as limiting. Other fluid recovery elements may be used.

Figure 3:
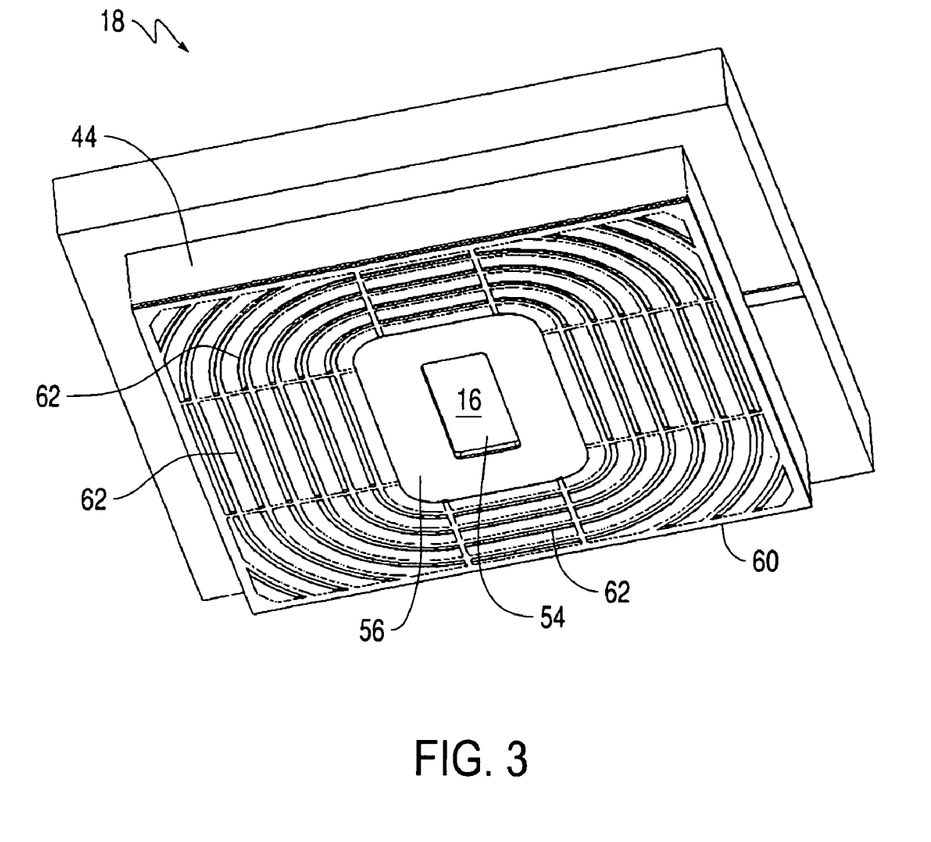
FIG. 3 is a bottom perspective view of another immersion element with a diverter element according to another embodiment of the present invention.

Referring to FIG. 3, a bottom-up perspective view of a diverter element 60 according to another embodiment is shown. In this embodiment, the individual diverter members 62 are "race-track" shaped and arranged in a concentric arrangement. Like the embodiment shown in FIG. 2B, the diverter members 62 surround the aperture 54 and non-fluid removal area 56. The embodiment of FIG. 3 is similar to that illustrated in FIGS. 2A-2B, except for the shape of the diverter members 62. Since like elements are given like reference numerals, a detailed explanation of all the elements is not repeated herein.

Figure 4A:
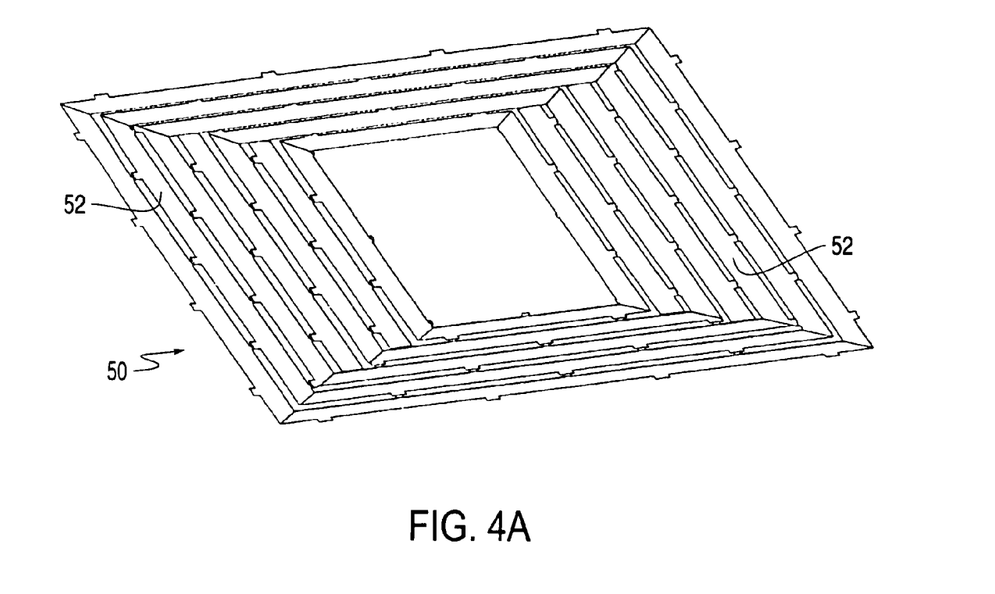
FIGS. 4A-4D are several perspective views of diverter elements according to various embodiments of the present invention.
Figure 4B:
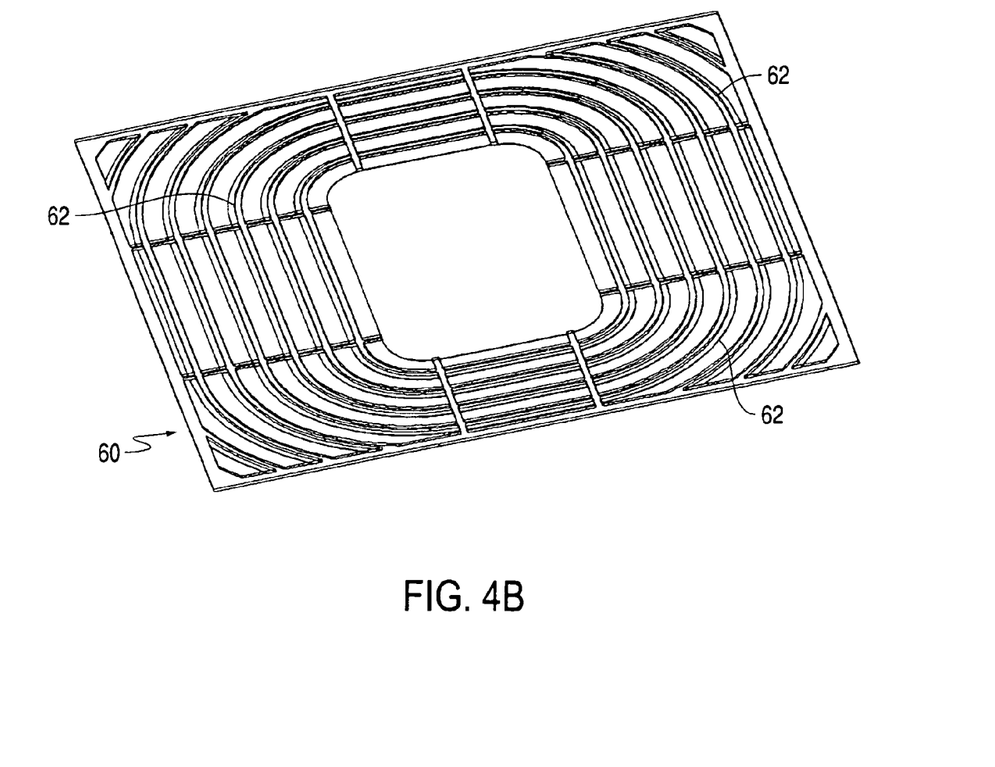

Referring to FIGS. 4A and 4B, perspective views of the diverter elements 50 and 60 are shown respectively. In each case, a plurality of individual diverter members 52 and 62 are shown in a concentric arrangement. Although the two different diverter elements 50 and 60 are shown, these embodiments should not be construed as limiting the invention. In various embodiments, the diverter members may vary in shape, such but not limited to, round, oval, square, or rectangular for example.

Figure 4C:
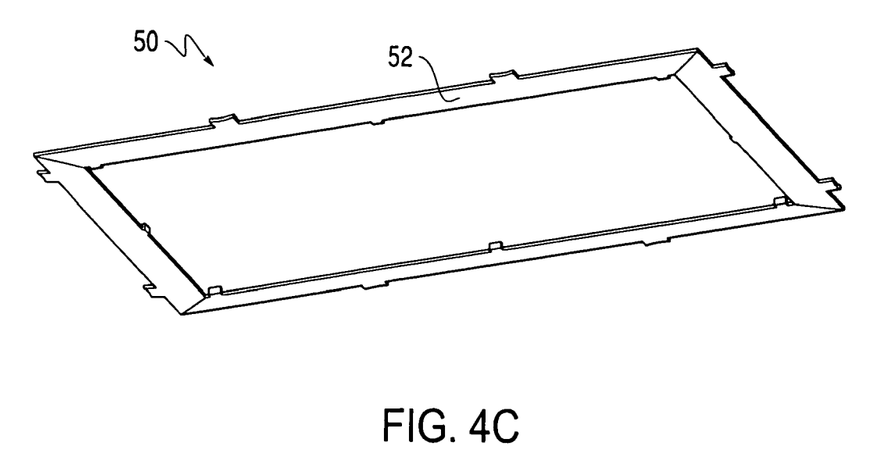
Figure 4D:
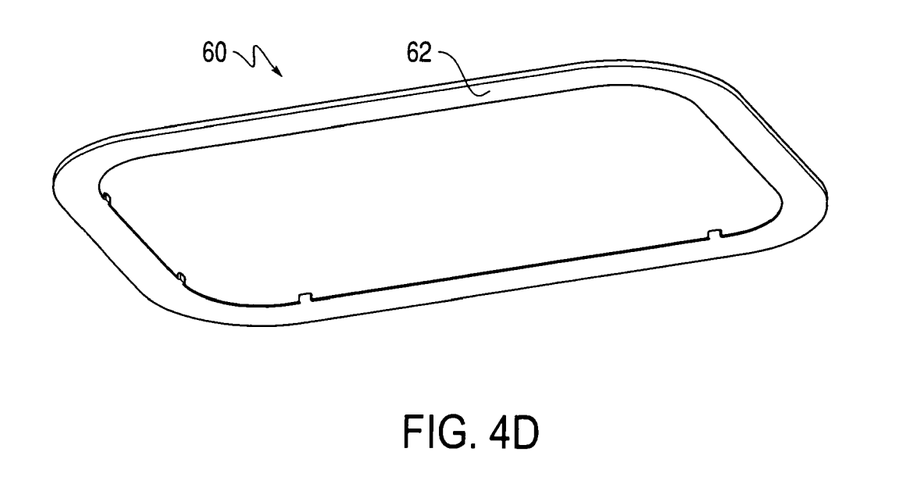

Referring to FIGS. 4C and 4D, the perspective views of the diverter elements 50 and 60 according to two additional embodiments are shown. In these embodiments, the diverter elements 50 and 60 each include only a single diverter member 52 and 62 respectively. Although not illustrated, these diverter elements would be positioned with respect to the immersion element 18 and fluid removal element 42 as illustrated in FIGS. 2B and 3.

Figure 5A:
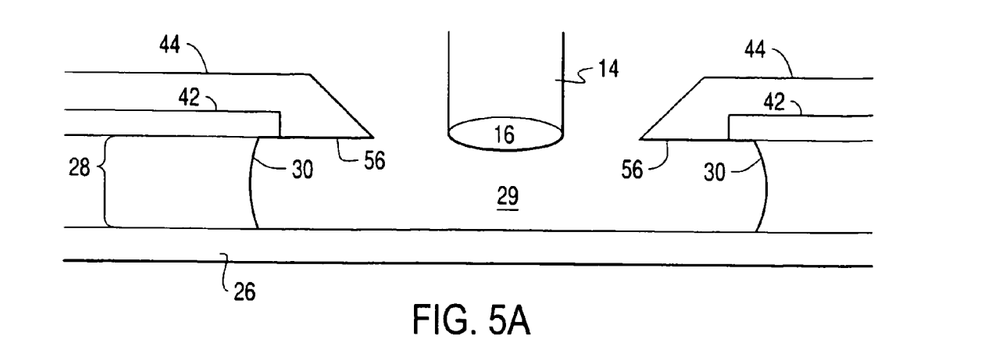
FIGS. 5A-5C are cross section views of the meniscus of the immersion fluid when the substrate is not being moved, during movement of the substrate but without a diverter element, and during movement of the substrate with the diverter element respectively.
Figure 5B:
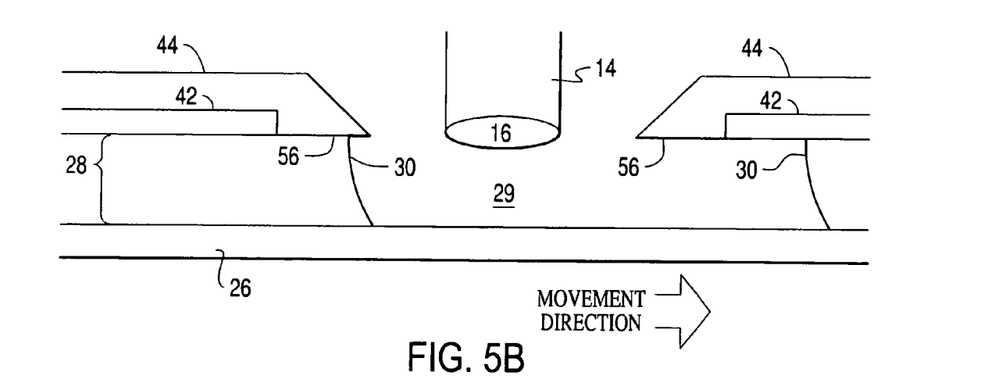
Figure 5C:
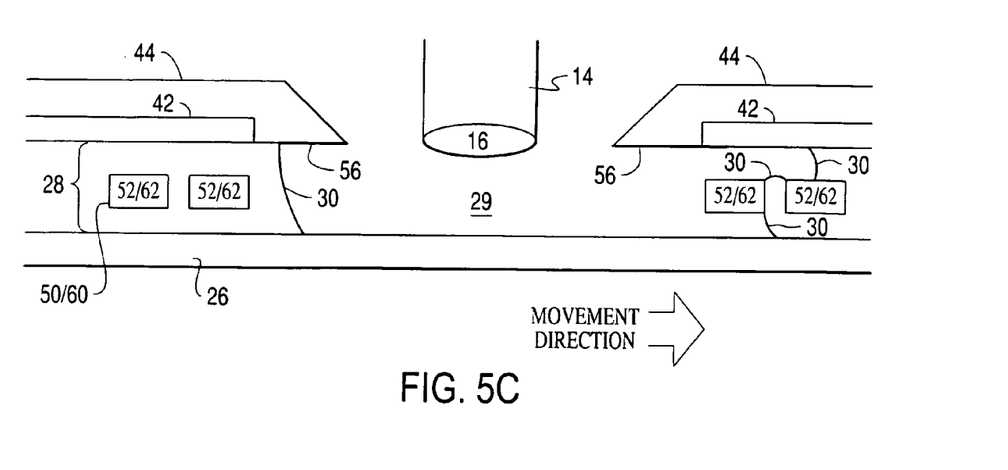

Referring to FIGS. 5A and 5B, two cross section views of the immersion fluid 29 in the space 28 including the gap between the last optical element 16, the fluid removal element 42 of the immersion element 18, and the substrate 26 is shown without the diverter element 50 or 60. In FIG. 5A, the substrate 26 is stationary (i.e., is not being moved), whereas in FIG. 5B, the substrate is being moved, for example during a long-move. In FIG. 5A, the body of immersion fluid 29, the shape of which is defined by the meniscus 30, is substantially uniform in shape. During movements of the substrate 26 on the other hand, the meniscus 30 at both the leading and trailing edges is stretched or pulled toward the direction of the movement, as illustrated in FIG. 5B.

Referring to FIG. 5C, a cross section view of the immersion fluid 29 with a diverter element 50 or 60, with the individual diverter members 52/62, positioned within the space 28 is shown. With the movement of the substrate 26 in the direction of the arrow, the meniscus 30 of the fluid 29 tends to be pulled at both the leading and trailing edges in the direction of the movement, similar to that illustrated in FIG. 5B for example. With the presence of the diverter members 52/62 in the gap between the immersion element 18 and the substrate 26, however, the meniscus 30 at both the leading and trailing edges is not pulled to such a large degree. Rather the meniscus 30 tends to stay closer to the last optical element 16 in the aperture 54. The diverter elements 50/60 tends to work by restricting the fluid flow under the individual diverter members 52/62, while directing the fluid upward toward the fluid removal element 42 for removal.

Figure 6:
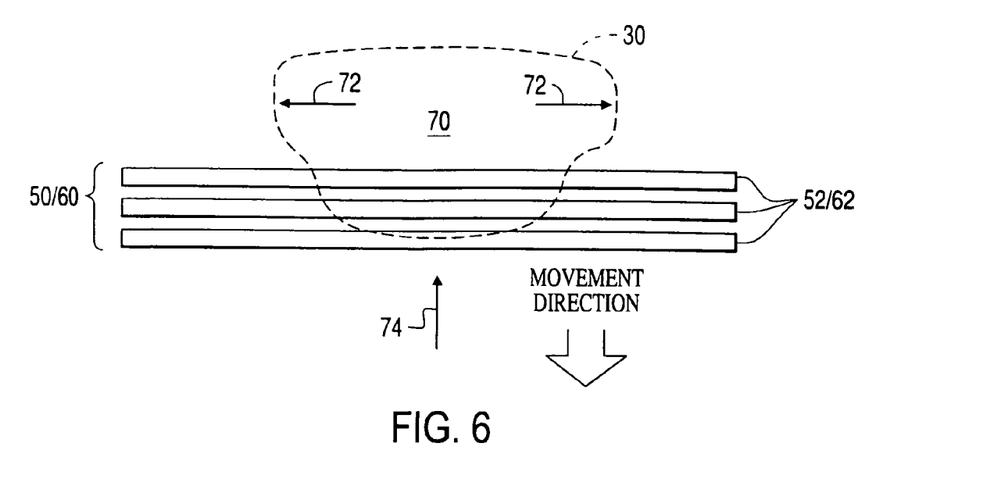
FIG. 6 is a footprint view created by the immersion fluid with a diverter element of the present invention during movement of the substrate.

Referring to FIG. 6, a top down view of the footprint 70 of the body of the immersion fluid with either diverter element 50/60 during a long-move is shown. As evidenced in the Figure, the individual diverter members 52/62 (of either diverter elements 50 or 60) divert the immersion fluid, thereby substantially containing the fluid 29 within the confines of the outer most diverter member 52/62 of the diverter element 50/60. In other words, the diverter members 52/62 cause the fluid 29 to spread out laterally relative to the direction of the movement of the substrate 26, as designated by the arrows 72. The members 52/62 cause surface tension forces to push or spread in a direction opposite the movement at the leading edge of the meniscus 30, as designated by arrow 74. The net effect of these forces is a containment of the immersion fluid within the confines of the outer most diverter element 52/62 of the diverter element 50/60.

Figure 7A:
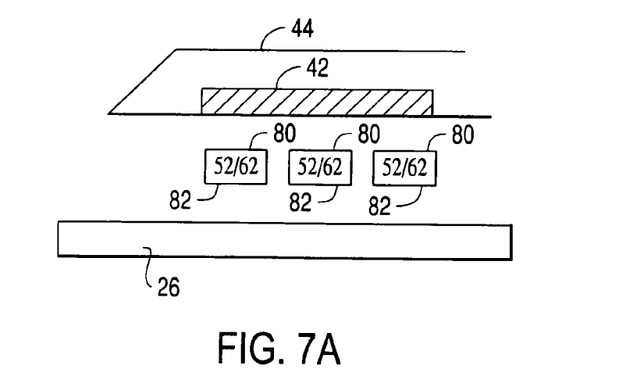
FIGS. 7A and 7B illustrate various embodiments of diverter members of the diverter element of the present invention.
Figure 7B:
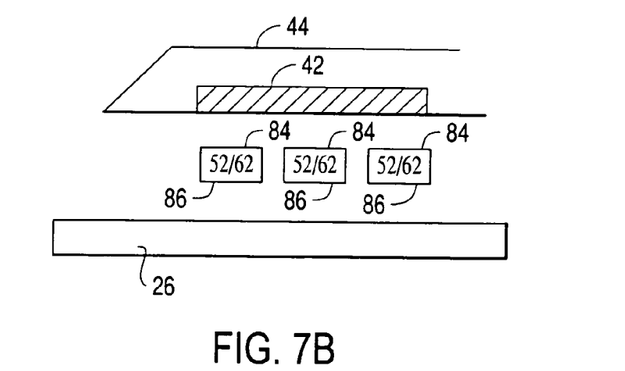

Referring to FIGS. 7A and 7B, various embodiments of diverter members 52/62 of the diverter elements 50/60 are illustrated. In FIG. 7A, the cross section of several diverter elements 52/62 are shown. In this embodiment, the top surface 80 of the elements are hydrophilic (liquid-philic), whereas the bottom surface 82 is hydrophobic (liquid-phobic). With this embodiment, the two surfaces 80 and 82 of the individual members 52/62 tend to push the immersion fluid upward toward the fluid removal element 42 of the immersion element 18. In the embodiment of FIG. 7B, the top surface 84 and the bottom surface 86 are both hydrophobic (liquid-phobic). This embodiment tends to spread the immersion fluid out laterally so as to widen the footprint.

It should be noted that the diverter members 52/62 as illustrated herein are "plate" like in shape with square or rectangular shaped cross sections (as best illustrated in FIGS. 7A and 7B. In accordance with various alternative embodiments, the diverter members 52/62 may be a variety of shapes, such as for example, round, oval, wedged, etc. The diverter members 52/62 also do not necessarily have to be positioned parallel to the substrate or centered in the gap 28 between the substrate 26 and the immersion element 18. In various embodiments, the diverter members 52/62 may be closer to the immersion element 18, closer to the substrate 26, or equidistant between the two. In yet other embodiments, the diverter members 52/62 may be angled up, angled down, and/or positioned anywhere in the gap between the substrate 26 and the immersion element 18.

Although the use of the diverter elements 50 and 60 have been described herein with regard to long-moves by the substrate 26, it should be made clear that the present invention should not be limited to just long-moves. Rather the diverter elements may be used to control the flow of the fluid 29 under the immersion element 18. In other word, the diverter element may be used to control the footprint of the immersion fluid 29 during movement of the substrate 26, including during both scanning and step and repeat movements.

Although the use of the diverter element has been described, the meniscus control element should not be limited to the diverter element. That is, the meniscus control element may not work as a "diverter". For example, the one or more plates described in the above embodiments may not work as a "diverter" to prevent or reduce leakage of immersion fluid 29.

Figure 8A:
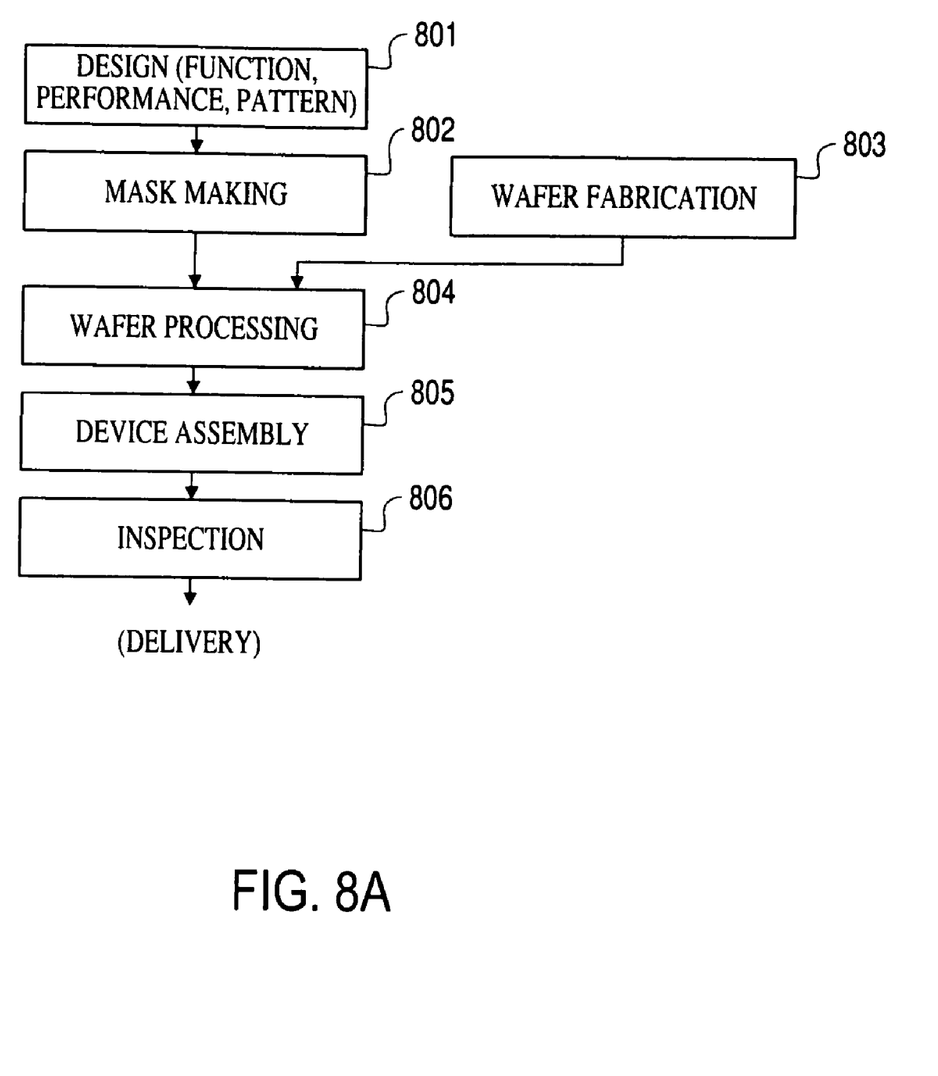
FIGS. 8A and 8B are flow diagrams illustrating the sequence of fabricating semiconductor wafers according to the present invention.

Semiconductor devices can be fabricated using the above described systems, by the process shown generally in FIG. 8A. In step 801 the device's function and performance characteristics are designed. Next, in step 802, a mask (reticle) having a pattern is designed according to the previous designing step, and in a parallel step 803 a wafer is made from a silicon material. The mask pattern designed in step 802 is exposed onto the wafer from step 803 in step 804 by a photolithography system described hereinabove in accordance with the present invention. In step 805 the semiconductor device is assembled (including the dicing process, bonding process and packaging process), finally, the device is then inspected in step 806.

Figure 8B:
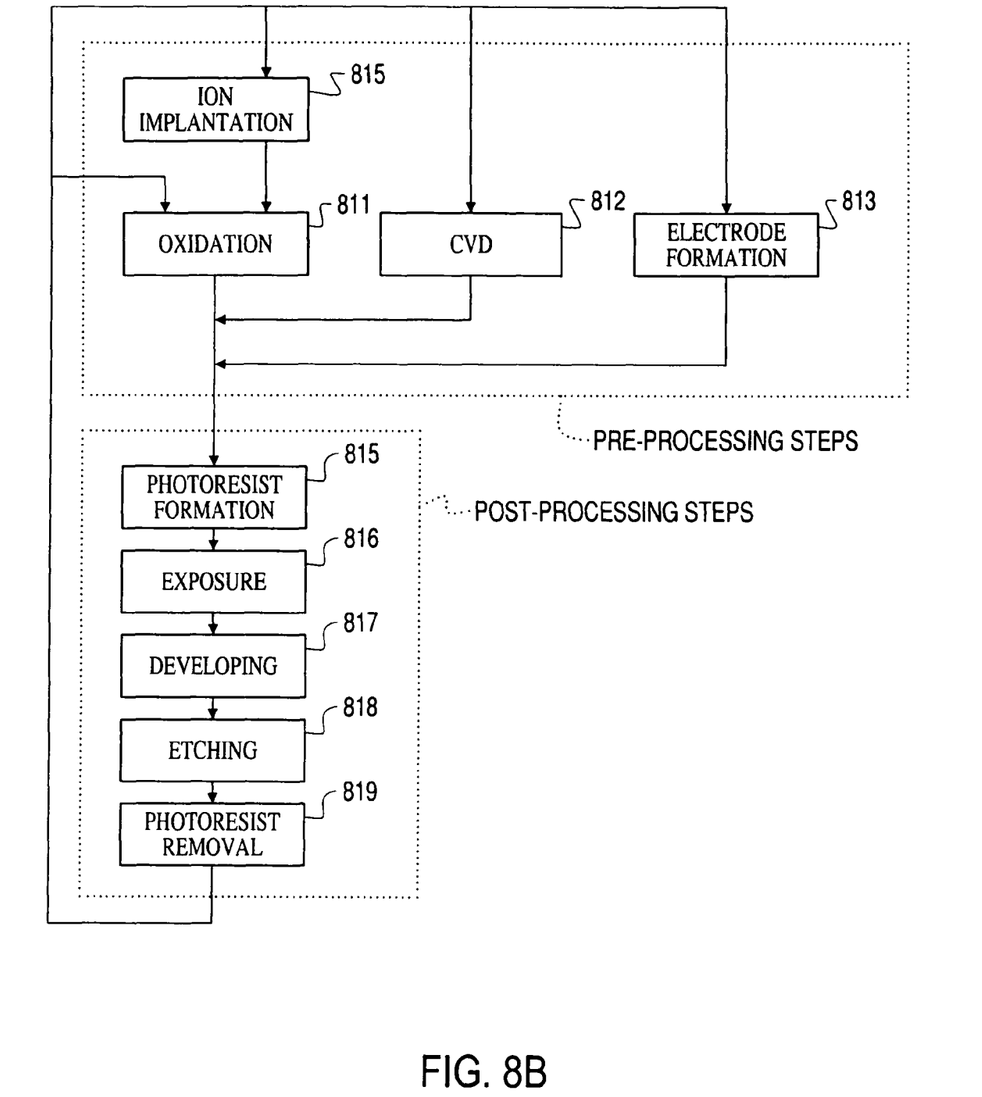

FIG. 8B illustrates a detailed flowchart example of the above-mentioned step 904 in the case of fabricating semiconductor devices. In FIG. 8B, in step 811 (oxidation step), the wafer surface is oxidized. In step 812 (CVD step), an insulation film is formed on the wafer surface. In step 813 (electrode formation step), electrodes are formed on the wafer by vapor deposition. In step 814 (ion implantation step), ions are implanted in the wafer. The above-mentioned steps 811-814 form the preprocessing steps for wafers during wafer processing, and selection is made at each step according to processing requirements.

It should be noted that the particular embodiments described herein are merely illustrative and should not be construed as limiting. For example, the substrate described herein does not necessarily have to be a semiconductor wafer. It could also be a flat panel used for making flat panel displays. Rather, the true scope of the invention is determined by the scope of the accompanying claims.

What is claimed is:

1. An apparatus, comprising:
    a substrate holder configured to hold a substrate having an imaging surface;
    a projection optical system having a last optical element and an optical axis, the projection optical system configured to project an image onto a target imaging area on the imaging surface of the substrate through an immersion liquid filled in a gap between the imaging surface of the substrate and the last optical element;
    an immersion element which maintains the immersion liquid in the gap between the imaging surface of the substrate and the last optical element, the immersion element including an aperture through which the image is projected onto the substrate and a non-fluid removal area which surrounds the aperture; and
    a plurality of plates positioned between the immersion element and the substrate such that there is a first gap in a direction of the optical axis between the immersion element and the plurality of plates and a second gap in the direction of the optical axis between the plurality of plates and the substrate, the plurality of plates being provided further away from the aperture than is the non-fluid removal area in a radial direction perpendicular to the optical axis, the plurality of plates being arranged in succession in the radial direction, and the plurality of plates being spaced from one another in the radial direction.

2. The apparatus of claim 1, wherein the immersion element has a bottom surface a part of which faces the substrate, the plurality of plates being arranged along the bottom surface of the immersion element.

3. The apparatus of claim 2, wherein the immersion element includes a fluid removal element through which the immersion liquid between the immersion element and the substrate is removed, the bottom surface of the immersion element includes the bottom surface of the fluid removal element.

4. The apparatus of claim 3, wherein the plurality of plates are disposed between the fluid removal element and the substrate.

5. The apparatus of claim 4, wherein the plurality of plates have respective top surfaces which face the bottom surface of the fluid removal element, and respective bottom surfaces which face the substrate.

6. The apparatus of claim 5, wherein the bottom surfaces of the plates are liquid-phobic.

7. The apparatus of claim 5, wherein the top surfaces of the plates are liquid-philic.

8. A device manufacturing method comprising:
    exposing a substrate by projecting a pattern image onto the substrate through an immersion liquid and the projection optical system of the apparatus of claim 1; and
    developing the exposed substrate.

* * * * *